United States Patent
Youn et al.

(10) Patent No.: US 9,460,816 B2
(45) Date of Patent: Oct. 4, 2016

(54) SEMICONDUCTOR MEMORY DEVICES AND MEMORY SYSTEMS INCLUDING THE SAME

(71) Applicant: Samsung Electronics Co., Ltd., Suwon-si (KR)

(72) Inventors: Jae-Youn Youn, Seoul (KR); Chul-Woo Park, Yongin-si (KR); Hak-Soo Yu, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 80 days.

(21) Appl. No.: 14/444,856

(22) Filed: Jul. 28, 2014

(65) Prior Publication Data

US 2015/0089327 A1   Mar. 26, 2015

(30) Foreign Application Priority Data

Sep. 25, 2013   (KR) .................. 10-2013-0113641

(51) Int. Cl.
*G11C 29/00* (2006.01)
*G06F 11/10* (2006.01)

(52) U.S. Cl.
CPC ......... *G11C 29/886* (2013.01); *G06F 11/1048* (2013.01)

(58) Field of Classification Search
CPC ... G11C 29/88; G11C 29/883; G11C 29/886; G11C 29/76
See application file for complete search history.

(56) References Cited

U.S. PATENT DOCUMENTS

| | | | |
|---|---|---|---|
| 6,199,150 B1 | 3/2001 | Yoshikawa | |
| 6,295,595 B1 * | 9/2001 | Wildenberg | G11C 8/10 365/230.02 |
| 7,467,337 B2 * | 12/2008 | Nakamura | G11C 29/42 714/704 |
| 7,523,274 B2 | 4/2009 | Ryu et al. | |
| 2003/0014688 A1 * | 1/2003 | Wu | G11C 29/88 714/6.32 |
| 2003/0167372 A1 * | 9/2003 | Lee | G11C 29/808 711/103 |
| 2006/0013048 A1 * | 1/2006 | Kim | G11C 29/82 365/200 |
| 2006/0107127 A1 * | 5/2006 | Park | G06F 11/1048 714/704 |
| 2009/0049364 A1 | 2/2009 | Jo et al. | |
| 2010/0211820 A1 * | 8/2010 | Kim | G06F 12/0246 714/5.1 |
| 2010/0299513 A1 | 11/2010 | Ryu et al. | |
| 2012/0004011 A1 | 1/2012 | Chun | |
| 2013/0114354 A1 | 5/2013 | Ryu | |
| 2014/0019674 A1 | 1/2014 | Park | |

FOREIGN PATENT DOCUMENTS

| | | |
|---|---|---|
| JP | 2002-055822 A | 2/2002 |
| KR | 10-2012-0078096 A | 7/2012 |

* cited by examiner

*Primary Examiner* — Steve Nguyen
(74) *Attorney, Agent, or Firm* — Muir Patent Law, PLLC

(57) ABSTRACT

The semiconductor memory device includes a memory cell array and an error correction code (ECC) circuit. The memory cell array is divided into a first memory region and a second memory region. Each of the first and second memory regions includes a plurality of pages each page including a plurality of memory cells connected to a word line. The ECC circuit corrects single-bit errors of the first memory region using parity bits. The first memory region provides a consecutive address space to an external device by correcting the single-bit errors using the ECC circuit and the second memory region is reserved for repairing at least one of a first failed page of the first memory region or a second failed page of the second memory region.

19 Claims, 16 Drawing Sheets

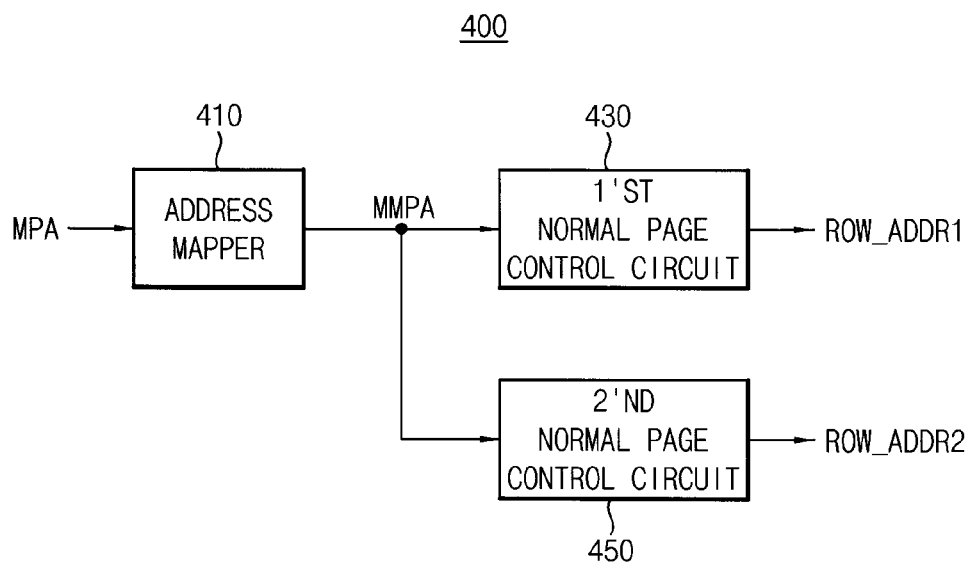

SEMICONDUCTOR MEMORY DEVICES AND MEMORY SYSTEMS INCLUDING THE SAME

CROSS-REFERENCE TO RELATED APPLICATION(S)

This US non-provisional application claims the benefit of priority under 35 USC §119 to Korean Patent Application No. 10-2013-0113641, filed on Sep. 25, 2013, in the Korean Intellectual Property Office (KIPO), the contents of which are incorporated herein in their entirety by reference.

BACKGROUND

1. Technical Field

Exemplary embodiments relate to semiconductor memory devices, and more particularly to a semiconductor memory device and a memory system including the same.

2. Discussion of the Related Art

Memory devices are employed in various electronic systems. Electronic systems typically require high-density memory devices. Due to limits of semiconductor micro-manufacturing processes, there is a general tradeoff between memory density and reliability. For example, as memory density increases, reliability tends to decrease typically. This reduction in reliability often leads to bad cells, which can reduce semiconductor yield.

SUMMARY

Some example embodiments provide a semiconductor memory device capable of providing a consecutive address space without including redundant cells.

Some example embodiments provide a memory system including the semiconductor memory device.

According to example embodiments, a semiconductor memory device includes a memory cell array and an error correction code (ECC) circuit. The memory cell array includes a plurality of memory cells arranged in rows and columns, the memory cell array is divided into a first memory region and a second memory region. Each of the first and second memory regions includes a plurality of pages, each page including a plurality of memory cells connected to a word line. The ECC circuit corrects single-bit errors of the first memory region using parity bits. The first memory region provides a consecutive address space to an external device by correcting the single-bit errors using the ECC circuit and the second memory region is reserved for repairing at least one of a first failed page of the first memory region or a second failed page of the second memory region.

In example embodiments, the first or the second failed page may be replaced by a pass page in the second memory region.

The pass page may be replaced in a reverse direction starting from a maximum page address of the second memory region.

In example embodiments, an access to the first or the second failed page may be blocked.

In example embodiments, the first failed page may have a multi-bit error.

The second failed page may have at least one of a single-bit error and a multi-bit error.

In example embodiments, the semiconductor memory device may not include a redundant memory cell array that replaces bad cells of the memory cell array.

In example embodiments, address space information of the first and second memory regions may be provided to an external device through a separate pin of the semiconductor memory device.

In example embodiments, the semiconductor memory device may further include a page control circuit that generates a first row address for accessing the first memory region and a second row address for accessing the second memory region based on a first memory access page address for accessing the memory cell array.

The page control circuit may include an address mapper that maps the first memory access page address to a second memory access page address; a first normal page control circuit that generates the first row address in response to the second memory access page address; and a second normal page control circuit that generates the second row address in response to the second memory access page address.

In example embodiments, the first memory region may include at least a first bank array including a first portion of memory cells that stores first main data, and a second portion of memory cells that stores first parity bits associated with the first main data, and the second memory region may include a second bank array including first and second portions of memory cells that stores second main data, and pages of the second portion of the second bank array are used for replacing failed pages of the first and second memory regions.

In example embodiments, the first memory region may include at least a first bank array including a first portion of memory cells that stores first main data, and a second portion of memory cells that stores first parity bits associated with the first main data, and the second memory region may include at least a second bank array including a first portion of memory cells that stores second main data, and pages of the first portion of the second bank array are used for replacing failed pages of the first memory region.

In example embodiments, the memory cell array may include at least a first bank array including a first portion of memory cells constituting the first memory region, a second portion of memory cells constituting the second memory region, and a third portion of memory cells that stores parity bits associated with main data stored in the first memory region, and a page of the second memory region is used for replacing a failed page of the first memory region.

According to example embodiments, a memory system includes a memory module including a plurality of semiconductor memory devices and a memory controller. The memory controller controls the semiconductor memory devices. Each of the semiconductor memory devices includes a memory cell array and an error correction code (ECC) circuit. The memory cell array includes a plurality of memory cells arranged in rows and columns, the memory cell array is divided into a first memory region and a second memory region. The ECC circuit corrects single-bit errors of the first memory region using parity bits. The first memory region provides a consecutive address space to the memory controller by correcting the single-bit errors by the ECC circuit and the second memory region is reserved for repairing at least one of a first failed page of the first memory region or a second failed page of the second memory region.

In example embodiments, first memory regions of at least two of the semiconductor memory devices may provide a consecutive address space to the memory controller by address mapping.

According to example embodiments, a semiconductor memory device includes a first memory region including a first plurality of pages having a first range of page addresses, and connected to a plurality of memory cells; a second memory region including a second plurality of pages having a second range of page addresses, and connected to a plurality of memory cells, wherein each page address of the first range is different from each page address of the second range; and a page control circuit configured to select any one of the first pages by a corresponding first page address and to select any one of second pages by a corresponding second page address, and configured to replace at least one of a first failed page of the first memory region or a second failed page of the second memory region with a first page of the second memory region.

Accordingly, the semiconductor memory device includes first and second memory regions, where the first memory region provides consecutive address space to an external memory controller by correcting single-bit errors by ECC circuit and the second memory region is reserved for bad page management for repairing failed cells or failed pages. Therefore, the semiconductor memory device is capable of providing a consecutive address space and does not need to include redundant cells for repairing failed cells.

BRIEF DESCRIPTION OF THE DRAWINGS

Illustrative, non-limiting exemplary embodiments will be more clearly understood from the following detailed description taken in conjunction with the accompanying drawings.

FIG. 8 is a block diagram illustrating the page control circuit in FIG. 3 according to example embodiments.

FIG. 9 illustrates an address mapper in FIG. 8 according to example embodiments.

DETAILED DESCRIPTION OF THE EMBODIMENTS

Figure 1:
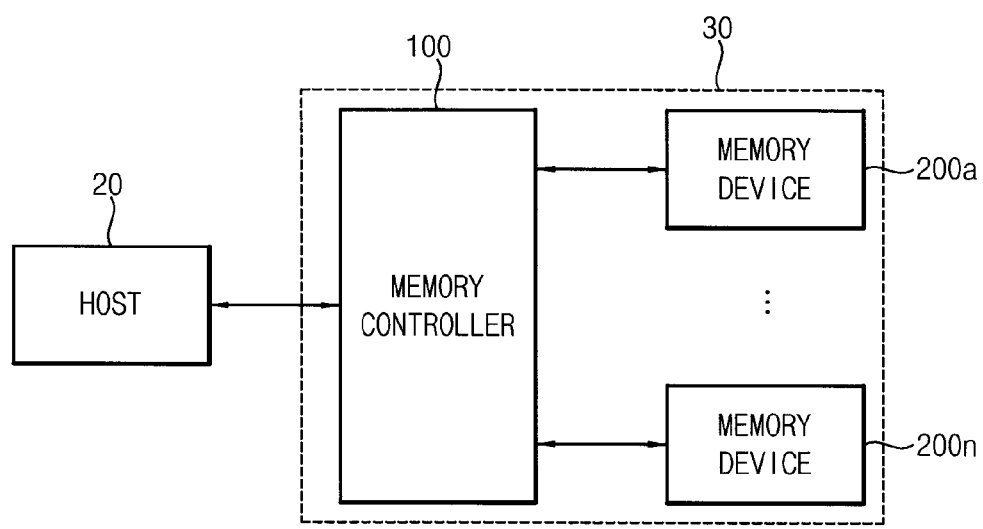
FIG. 1 is a block diagram illustrating an electronic system according to example embodiments.

Various exemplary embodiments will be described more fully hereinafter with reference to the accompanying drawings, in which some exemplary embodiments are shown. The present disclosure may, however, be embodied in many different forms and should not be construed as limited to the example embodiments set forth herein. These example embodiments are just that examples and many implementations and variations are possible that do not require the details provided herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present disclosure. As used herein, the singular forms "a," "an" and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present disclosure. Exemplary embodiments of aspects of the present disclosure explained and illustrated herein include their complementary counterparts. The same reference numerals or the same reference designators denote the same elements throughout the specification.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 includes a host 20 and a memory system 30. The memory system 30 includes a memory controller 100 and a plurality of semiconductor memory devices 200a~200n.

The host 20 may communicate with the memory system 30 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 20 may communicate with the memory system 30 through interface protocols such as Universal Serial Bus (USB), Multi-Media Card (MMC), Enhanced Small Disk Interface (ESDI), or Integrated Drive Electronics (IDE).

The memory controller 100 controls overall operation of the memory system 30. The memory controller 100 controls overall data exchange between the host 20 and the semiconductor memory devices 200a~200n. For example, the memory controller 100 writes data in the semiconductor memory devices 200a~200n or reads data from the semiconductor memory devices 200a~200n in response to request from the host 20.

In addition, the memory controller 100 issues operation commands to the semiconductor memory devices 200a~200n for controlling the semiconductor memory devices 200a~200n. These commands may include read, write and refresh commands. The commands may be issued in the form of transmitting a command code to identify the command along with an address, identifying a memory location. For some operations, such as some refresh operations, the command may be issued in the form a command code only and one or more addresses may be provided internally by the semiconductor memory device, or issued in the form of a command code with an address which is used by the semiconductor memory device to generate multiple addresses corresponding to the command (e.g., as a start address for a burst refresh operation for multiple addresses generated by an internal counter of the semiconductor memory device).

In some embodiments, each of the semiconductor memory devices 200a~200n may be, for example, a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or may be other volatile semiconductor memory devices that may include a refresh operation. In some embodiments, one or more of the semiconductor memory devices may be a non-volatile semiconductor memory device in which a data refresh operation or similar operation may useful some time period, such as a data copyback operations responsive to determining that read disturbances may have altered programming states of a NAND flash semiconductor memory device.

Figure 2:
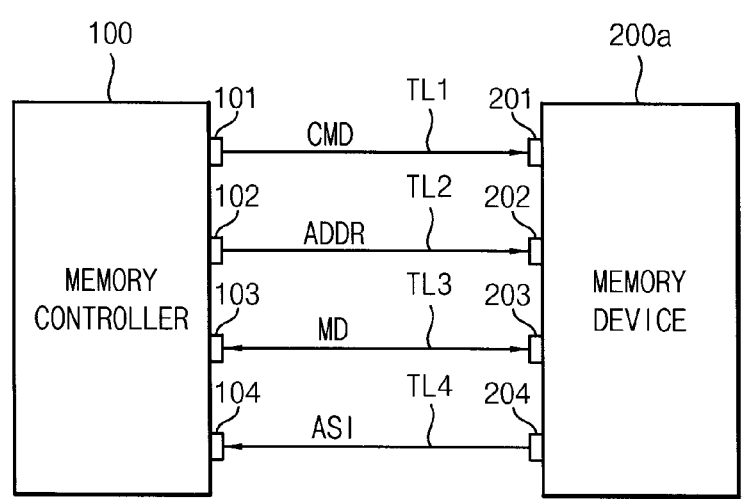
FIG. 2 is a block diagram illustrating the memory system in FIG. 1 according to example embodiments.

FIG. 2 is a block diagram illustrating the memory system in FIG. 1 according to example embodiments.

In FIG. 2, only one semiconductor memory device 200a in communication with the memory controller 100 is illustrated for convenience. However, the details discussed herein related to semiconductor memory device 200a may equally apply to the other semiconductor memory devices 200b~200n.

Referring to FIG. 2, the memory system 30 includes the memory controller 100 and the semiconductor memory device 200a. Each of the memory controller 100 and the semiconductor memory device 200a may be formed as a separate semiconductor chip or as a separate group of chips (e.g., semiconductor memory device 200a may a stack of semiconductor chips in a semiconductor package). The memory controller 100 and the semiconductor memory device 200a may be connected to each other through corresponding command pins 101 and 201, corresponding address pins 102 and 202, corresponding data pins 103 and 203 and corresponding separate pins 104 and 204. The command pins 101 and 201 transmit a command signal CMD through a command transmission line TL1, the address pins 102 and 202 transmit an address signal ADDR through an address transmission line TL2, the data pins 103 and 203 exchange main data MD through a data transmission line TL3 and the separate pins 104 and 204 transmit address space information ASI through a separate transmission line TL4.

Referring to FIGS. 1 and 2, the memory controller 100 may input data to the semiconductor memory device 200a or may output data from the semiconductor memory device 200a through the data pins 103 and 203 based on the request from the host 20. In addition, the memory controller 100 may input address to the semiconductor memory device 200a through the address pins 102 and 202. In addition, the semiconductor memory device 200a may provide the address space information ASI to the memory controller through the separate pins 204 and 104.

The semiconductor memory device 200a may include a memory cell array that includes at least first and second memory regions, wherein the first memory region provides consecutive address space and the second memory region repairs bad cells. The address space information ASI associated with addresses of the first and second memory regions may be provided to the memory controller 100. The memory controller 100 may access the semiconductor memory device 200a based on received address space information ASI. When the memory controller 100 accesses the semiconductor memory device 200a with both of the first and second memory regions, the semiconductor memory device 200a may internally map addresses associated with the second memory region to the first memory region and map addresses associated with the first memory region to the second memory region. Therefore, the semiconductor memory device 200a may provide consecutive address space to the memory controller 100.

Figure 3:
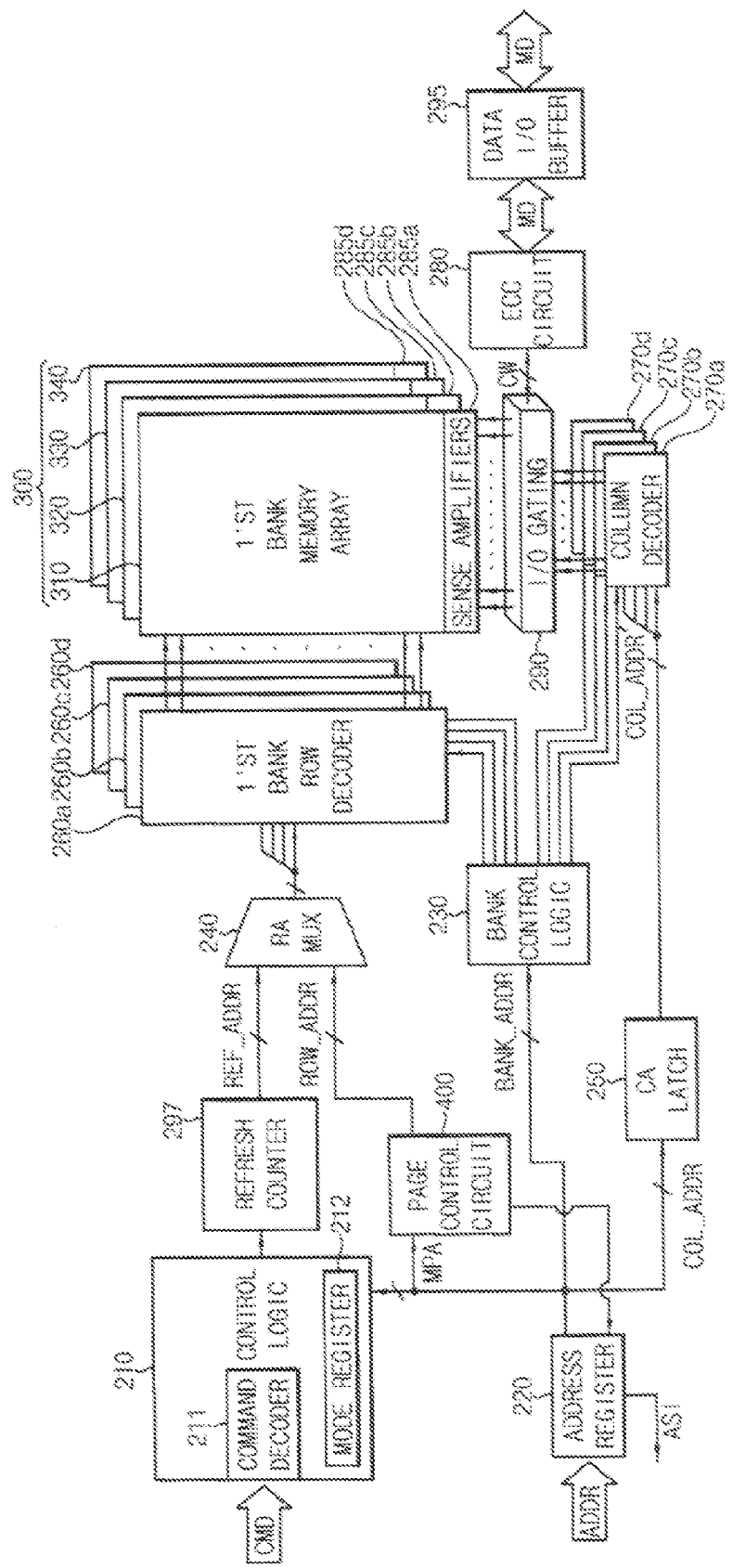
FIG. 3 is a block diagram illustrating the semiconductor memory device in FIG. 2 according to example embodiments.

FIG. 3 is a block diagram illustrating the semiconductor memory device in FIG. 2 according to example embodiments.

Referring to FIG. 3, the semiconductor memory device 200a includes a control logic 210, an address register 220, a bank control logic 230, a row address multiplexer 240, a column address latch 250, a row decoder, a column decoder, a memory cell array 300, a sense amplifier circuit, an input/output (I/O) gating circuit 290, an error correction code (ECC) circuit 280, a data input/output (I/O) buffer 295, a refresh counter 297 and a page control circuit 400.

The memory cell array 300 may include first through fourth bank arrays 310~340. The row decoder may include first through fourth bank row decoders 260a, 260b, 260c and 260d respectively coupled to the first through fourth bank arrays 310~340, the column decoder may include first through fourth bank column decoders 270a, 270b, 270c and 270d respectively coupled to the first through fourth bank arrays 310~340, and the sense amplifier circuit may include first through fourth bank sense amplifiers 285a, 285b, 285c and 285d respectively coupled to the first through fourth bank arrays 310~340. The first through fourth bank arrays 310~340, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks Although the semiconductor memory device 200a is illustrated in FIG. 3 as including four banks, the semiconductor memory device 200a may include any number of banks.

In some embodiments, the semiconductor memory device 200a may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

The address register 220 may receive an address ADDR including a bank address BANK_ADDR, a memory access page address MPA and a column address COL_ADDR from the memory controller 100. The address register 220 may provide the received bank address BANK_ADDR to the bank control logic 230, may provide the received memory access page address MPA to the page control circuit 400, and may provide the received column address COL_ADDR to the column address latch 250.

The page control circuit 400 may generate a row address ROW_ADDR to be provided to the row address multiplexer 240 based on the memory access page address MPA.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from page control circuit 400, and may receive a refresh row address REF_ADDR from the refresh counter 297. The row address multiplexer 240 may selectively output the row address ROW_ADDR or the refresh row address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line (e.g., a page) corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some embodiments, in a burst mode, the column address latch 250 may generate column addresses COL_ADDR' that increment from the received column address COL_ADDR. The column address latch 250 may apply the temporarily stored or generated column address COL_ADDR' to the first through fourth bank column decoders 270a, 270b, 270c and 270d.

The activated one of the first through fourth bank column decoders 270a, 270b, 270c and 270d may decode the column address COL_ADDR' output from the column address latch 250, and may control the input/output gating circuit 290 to output data corresponding to the column address COL_ADDR.

The I/O gating circuit 290 may include circuitry for gating input/output data. The I/O gating circuit 290 may further include an input data mask logic, read data latches for storing data output from the first through fourth bank arrays 310~340, and write drivers for writing data to the first through fourth bank arrays 310~340.

Main data MD to be read from one bank array of the first through fourth bank arrays 310~340 may be sensed by a sense amplifier coupled to the one bank array, and may be stored in the read data latches. The main data MD stored in the read data latches may be provided to the memory controller via the ECC circuit 280 the data I/O buffer 295. Main data MD to be written to one bank array of the first through fourth bank arrays 310~340 may be provide from the memory controller to the data I/O buffer 295. Main data MD provided to the data I/O buffer 295 may be encoded in the ECC circuit 280, and may be written to the one bank array via the write drivers.

The data I/O buffer 295 may provide the ECC circuit 280 with the main data MD from the memory controller 100.

The ECC circuit 280 receives the main data MD from the memory controller 100, encodes the main data MD to generate parity bits and provides to the I/O gating circuit 290 with a codeword CW including the main data MD and the parity bits. In addition, the ECC circuit 280 receives read codeword CW from the I/O gating circuit 290 and decodes the read codeword CW to provide a read main data MD to the data I/O buffer 295.

The control logic 210 may control operations of the semiconductor memory device 200a. For example, the control logic 210 may generate control signals for the semiconductor memory device 200a to perform a write operation or a read operation. The control logic 210 may include a command decoder 211 that decodes a command CMD received from the memory controller and a mode register 212 that sets an operation mode of the volatile semiconductor memory device 200. For example, the mode register 212 may store the address space information ASI and provide the ASI to the memory controller 100. For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may further receive a clock signal (CLK) and a clock enable signal (/CKE) for operating the semiconductor memory device 200a in a synchronous manner. The control logic 210 may control the refresh counter 297 to generate the refresh row address REF_ADDR.

Figure 4:
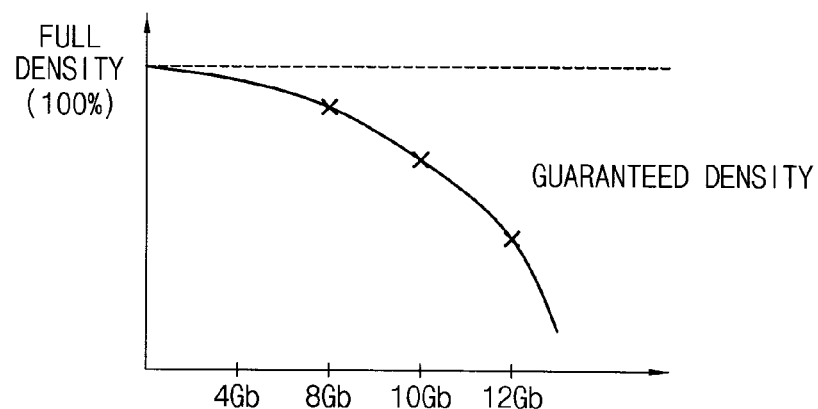
FIG. 4 is an exemplary graph illustrating an expected density of a DRAM as a function of DRAM scaling.

FIG. 4 is an exemplary graph illustrating an expected density of a DRAM as a function of DRAM scaling.

Referring to FIG. 4, the density of the DRAM is scaled to 4 Gb, 8 Gb, 16 Gb and 18 Gb based on 2^n (n is a number of addresses). As the memory density of the DRAM increases, the percentage of a full density of DRAM typically decreases due to an increase in bad cells. To secure a full density of a DRAM, the number of redundant cells for repairing bad cells can be increased.

Figure 5:
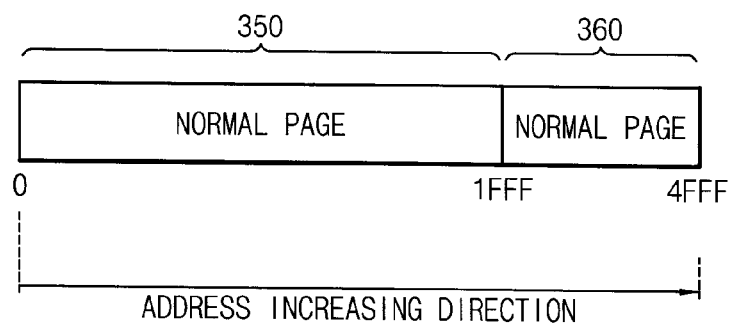
FIG. 5 illustrates the memory cell array in the semiconductor memory device of FIG. 3 according to example embodiments.

FIG. 5 illustrates the memory cell array in the semiconductor memory device of FIG. 3 according to example embodiments.

Referring to FIG. 5, the memory cell array 300 may include first and second memory regions 350 and 360. The first memory region 350 includes a plurality of first normal memory cells arranged in rows and columns. Rows of the first normal memory cells may be referred to as first normal pages. The first normal pages may include a first range of page addresses, for example, 0000~1FFE. The second memory region 360 includes a plurality of second normal memory cells arranged in rows and columns. Rows of the second normal memory cells may be referred to as second normal pages. The second normal pages may include a second range of page addresses, for example, 1FFF~4FFF.

When at least one of the first normal memory cells in the first memory region 350 has a single-bit error, the single-bit error may be corrected using the parity bits by the ECC circuit 280, and the first memory region 350 may provide a consecutive address space to the memory controller 100. When the first normal memory cells in the first memory region 350 have multi-bit errors which the ECC circuit 280 cannot correct, a failed page including the multi-bit errors may be replaced by a pass page in the second memory region 360. The pass page of the second memory region does not include defective cells. In one embodiment, when the failed page in the first memory region 350 is replaced by the pass page in the second memory region 360, the failed page is replaced by the pass page in a reverse direction starting from a maximum page address of the second memory region 360. Therefore, consecutive page addressing of the memory cell array 300 is possible.

When at least one of the second normal memory cells has a single-bit error or a multi-bit error, an access to a failed page including the at least one second normal memory cell having the single-bit error or the multi-bit error may be blocked. In some embodiment, when at least one of the second normal memory cells has a single-bit error or a multi-bit error, the failed page in the second memory region 630 may be replaced by a pass page in the second memory region 360. In one embodiment, the failed page in the second memory region 360 is replaced by the pass page in the second memory region 360 in a reverse direction starting from a maximum page address of the second memory region 360. The first memory region 350 may provide a consecutive address space to a memory controller by remapping. Therefore, the consecutive page address of the memory cell array 300 is possible.

In FIG. 5, it is assumed that page addresses of the memory cell array 300 consecutively increase in a direction indicated by an arrow. A least significant page address of the memory cell array 300 is set at the left edge of the first memory region 350 and a most significant page address of the memory cell array 300 is set at the right edge of the second memory region 360. The entire page addresses of the first and second memory regions 350 and 360 may be a factor used to calculate a full density of the semiconductor memory device 200a.

As mentioned above, when a single-bit error is generated in the first memory region 350, the single-bit error may be corrected by the ECC circuit 280, and the first memory region 350 may provide the consecutive address space in case where the single-bit error occurs. When multi-bit errors occur in the first memory region 350, the failed page including the multi-bit errors may be replaced by a pass page in the second memory region 360 in a reverse direction starting from a maximum page address of the second memory region 360. The first memory region 350 may provide the consecutive address space by remapping. Therefore, the entire page addresses of the first memory region 350 may be factors used to calculate a minimum density of the semiconductor memory device 200a.

Figure 6:
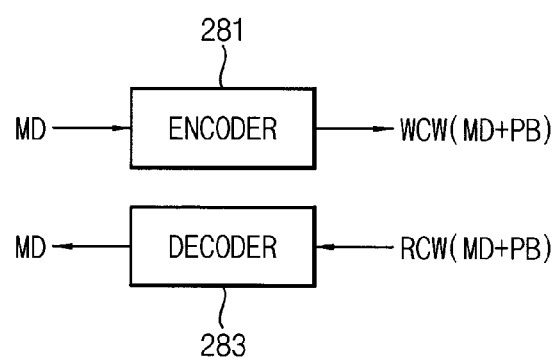
FIG. 6 is a block diagram illustrating the ECC circuit in FIG. 3 according to example embodiments.

FIG. 6 is a block diagram illustrating the ECC circuit in FIG. 3 according to example embodiments.

Referring to FIG. 6, the ECC circuit 208 includes an encoder 281 and a decoder 283.

The encoder 281 receives the main data MD, encodes the main data MD to generate parity bits PB and provides the I/O gating circuit 290 with a codeword (or write codeword) WCW including the main data MD and the parity bits PB in a write operation.

The decoder 283 receives a codeword (or read codeword) RCW including the main data MD and the parity bits PB from the I/O gating circuit 290, corrects errors in the codeword using parity bits PB and provides error-corrected main data MD to the memory controller 100 through the data I/O buffer 295 in a read operation.

Figure 7:
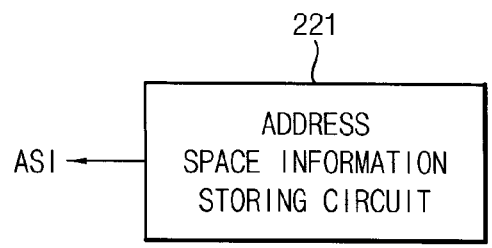
FIG. 7 illustrates an address space information storing circuit according to example embodiments.

FIG. 7 illustrates an address space information storing circuit according to example embodiments.

Referring to FIG. 7, in one embodiment, an address space information storing circuit 221 may be included in the address register in FIG. 3. The address space information storing circuit 221 stores address space information ASI, and is connected to the page control circuit 400. The address register 220 receives the address space information ASI from the page control circuit 400 and provides the address space information ASI to the memory controller 100. In another embodiment, the address space information ASI may be stored in the mode register 212 of FIG. 3, and the mode register 212 may provide the address space information ASI to the memory controller 100.

FIG. 8 is a block diagram illustrating the page control circuit in FIG. 3 according to example embodiments.

Referring to FIG. 8, the page control circuit 400 may include an address mapper 410, and first and second normal page control circuits 430 and 450.

The address mapper 410 maps a first memory access page address MPA to a corresponding second memory access page address MMPA. For example, the first memory access page address MPA may be a logical address received from the memory controller 100 and the second memory access page address MMPA may be a physical address of the memory cell array 300.

The first normal page control circuit 430 may generate a first row address ROW_ADDR1 that blocks an access to a failed page when the second memory access page address MMPA matches with a failed page of the first memory region 350. The first normal page control circuit 430 may generate a first row address ROW_ADDR1 that corresponds to the second memory access page address MMPA when the second memory access page address MMPA does not match with a failed page of the first memory region 350.

The second normal page control circuit 450 controls access to the memory cell array 300 such that a pass page of the second memory region 360 is accessed instead of a failed page of the first memory region 350. When the first memory region 350 has at least one failed page, the second normal page control circuit 450 generates a second row address ROW_ADDR2 with an address of a pass page of the second memory region 360, which replaces the failed page of the first memory region 350. The first normal page control circuit 430 is connected to the first memory region 350 and the second normal page control circuit 450 is connected to the second memory region 360.

In addition, the page control circuit 400 may provide the address register 220 in FIG. 3 with address information of the first and second memory regions 350 and 360 as the address space information ASI. The address information of the first and second memory regions 350 and 360 may include information of the first and second row addresses ROW_ADDR1 and ROW_ADDR2.

FIG. 9 illustrates an address mapper in FIG. 8 according to example embodiments.

Referring to FIG. 9, the address mapper 410 in FIG. 8 may be implemented by an address mapping table 411. The address mapping table 411 maps each of first memory access page addresses MPA1~MPAn to corresponding one of second memory access page addresses MMPA1~MMPAn. For example, a consecutive address space of the first memory region 350 may be provided to a memory controller by the address mapper 410 based on the address mapping table 411.

Figure 10:
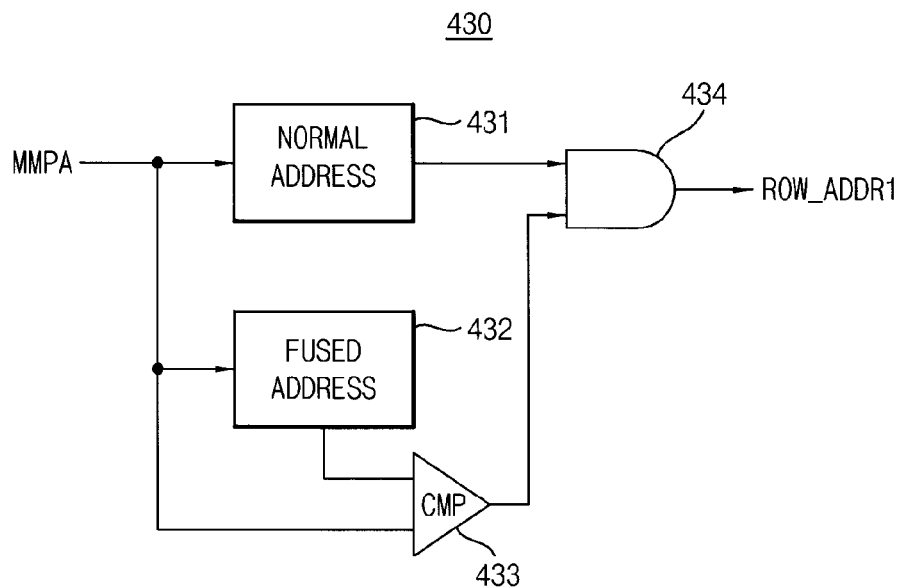
FIG. 10 is a block diagram of the first normal page control circuit in FIG. 8 according to example embodiments.

FIG. 10 is a block diagram of the first normal page control circuit in FIG. 8 according to example embodiments.

Referring to FIG. 10, the first normal page control circuit 430 determines whether the second memory access page address MMPA accesses first normal pages of the first memory region 350. The first normal page control circuit 430 includes a first storage circuit 431, a second storage circuit 432, a comparator 433 and a logic circuit 434.

The first storage circuit 431 stores the second memory access page address MMPA received from the address mapper 410. The second storage circuit 432 also receives the second memory access page address MMPA received from the address mapper 410. When the second memory access page address MMPA is an address of a failed page of the first memory region 350, the second storage circuit 432 stores the address of the failed page. The second storage circuit 432 can be implemented using a fuse circuit such as a laser fuse circuit or an anti-fuse circuit. The second storage circuit 432 programs the address of the failed page (hereinafter, a "failed page address") in the fuse circuit.

The comparator 433 compares the second memory access page address MMPA of the first storage circuit 431 with the failed page address of the second storage circuit 432 and outputs a result of the comparison. For example, when the second memory access page address MMPA of the first storage circuit 431 is the same as the failed page address of the second storage circuit 432, the comparator 433 outputs a logic low level. On the other hand, when the second memory access page address MMPA of first storage circuit 431 is not the same as the failed page address of second storage circuit 432, the comparator 433 outputs a logic high level.

The logic circuit 434 receives the second memory access page address MMPA of first storage circuit 431 and the output of comparator 433 and outputs the first row address ROW_ADDR1. The logic circuit 434 can be implemented by, for example, an AND gate. When the output of comparator 433 is the logic low level, the first row address ROW_ADDR1 is output with the logic low level. When the output of comparator 433 is the logic high level, the first row address ROW_ADDR1 is output with the same as the second memory access page address MMPA of the first storage circuit 431. Accordingly, where the second memory access page address MMPA is the same as the failed page address, the first normal page control circuit 431 blocks an access to the failed page. When the memory access page address MMPA is not the same as the failed page address, the first normal page control circuit 430 allows an access of the second memory access page address MMPA to the first memory region 350.

Figure 11:
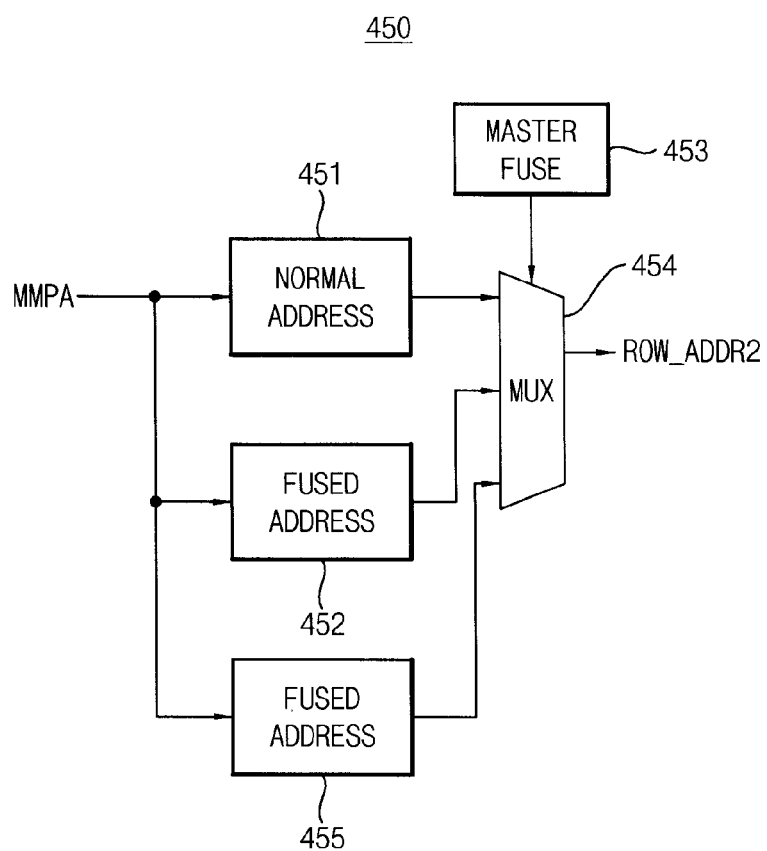
FIG. 11 is a block diagram of the second normal page control circuit in FIG. 8 according to example embodiments.

FIG. 11 is a block diagram of the second normal page control circuit in FIG. 8 according to example embodiments.

Referring to FIG. 11, the second normal page control circuit 450 determines whether the second memory access page address MMPA accesses the second normal pages of the second memory region 360. The second normal page control circuit 450 includes a first storage circuit 451, a second storage circuit 452, a third storage circuit 455, a selection control circuit 453, and a selection circuit 454.

The first storage circuit 451 stores the second memory access page address MMPA received from the address mapper 410. The second and third storage circuits 452 and 455 also receive the second memory access page address MMPA received from the address mapper 410. When the second memory access page address MMPA is an address of a failed page of the first memory region 350, the second storage circuit 452 stores the address of a pass page of the second memory region 360, which replaces the address of the failed page of the first memory region 350. When the second memory access page address MMPA is an address of a failed page of the second memory region 360, the third storage circuit 455 stores the address of the a pass page of the second memory region 360, which replaces the address of the failed page of the second memory region 360. Each of the second and third storage circuits 452 and 455 can be implemented using a fuse circuit such as a laser fuse circuit or an anti-fuse circuit. Each of the second and third storage circuits 452 and 455 programs the address of the pass page (hereinafter, a "pass page address") in the fuse circuit.

The selection control circuit 453 stores a control signal that instructs replacement of the failed page of the first memory region 350 with a pass page of the second memory region 360 and replacement of the failed page of the second memory region 360 with a pass page of the second memory region 360. The selection control circuit 453 may be implemented using a laser fuse circuit or an anti-fuse circuit. For instance, the selection control circuit 453 may program the failed page address in anti-fuse circuit.

The selection circuit 454 selects the second memory access page address MMPA of the first storage circuit 451 or the address of the pass page to replace a failed page, in response to the control signal of selection control circuit 453, and outputs a selected address as the second row address ROW_ADDR2. When the second memory access page address MMPA of the first storage circuit 451 is selected, the second row address ROW_ADDR2 is output like the second memory access page address MMPA of the second memory region 360. When the address of the pass page address that replaces the failed page of the first memory region 350 is selected, the second row address ROW_ADDR2 is output like the address of the pass page. When the address of the pass page address that replaces the failed page of the second memory region 350 is selected, the second row address ROW_ADDR2 is output like the address of the pass page.

When the failed page is generated in first memory region 350 and needs to be repaired, the second normal page control circuit 450 allows access to the pass page of the second memory region 360 that replaces the failed page. When the failed page of the first memory region 350 does not need to be repaired, the second normal page control circuit 450 allows access to the second memory access page address MMPA of the second memory region 360.

Figure 12:
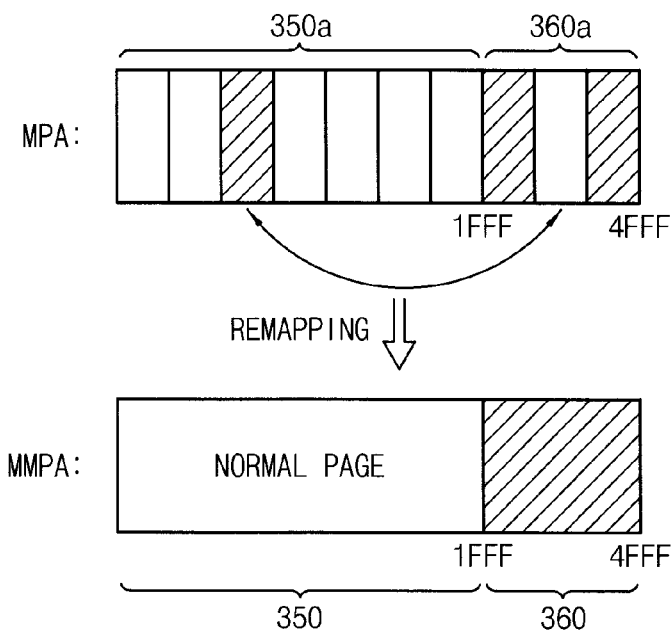
FIG. 12 illustrates that addresses are remapped in a semiconductor memory device according to example embodiments.

FIG. 12 illustrates that addresses are remapped in a semiconductor memory device according to example embodiments.

Referring to FIG. 12, when selected pages by the first memory access page address MPA received from the memory controller 100 are located in the first and second memory regions 350a and 360a with no consecutive page addresses, the second memory access page address MMPA may provide consecutive page addresses with respect to the first memory region 350 and the second memory region 360 used to replace failed cells or failed pages by address remapping.

Figure 13:
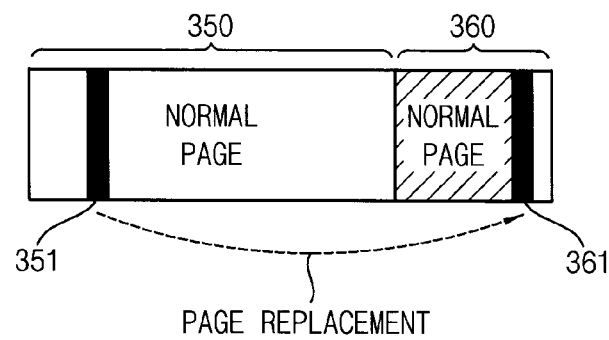
FIG. 13 illustrates that a failed page is replaced with a pass page in a semiconductor memory device according to example embodiments.

FIG. 13 illustrates that a failed page is replaced with a pass page in a semiconductor memory device according to example embodiments.

Referring to FIG. 13, when the first memory region 350 includes a failed page 351 having multi-bit errors, the failed page 351 of the first memory region 350 may be replaced with a pass page 361 having no errors of the second memory region 360. For example, when a memory access page address MPA corresponding to the failed page of the first memory region 350 is received from the memory controller 100, the pass page 361 of the second memory region 360 is selected by the page control circuit 400. At that time, the address mapper 410 maps the memory access page address MPA corresponding to the failed page to the second memory access page address MMPA corresponding to the pass page 361. Therefore, the first memory region 350 may provide consecutive address space to the memory controller 100. For example, the failed page 351 of the first memory region 350 may be replaced with the pass page 361 of the second memory region 360 in a reverse direction starting from a maximum page address of the second memory region 360.

Figure 14:
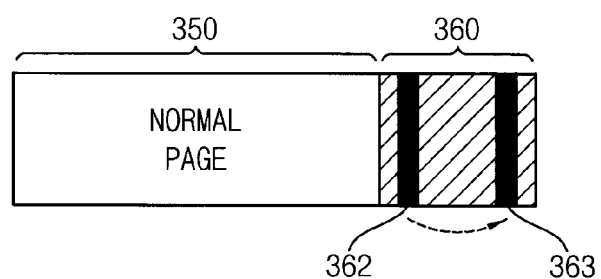
FIGS. 14 and 15 illustrate that errors occur in the second memory region of a semiconductor memory device according to example embodiments.
Figure 15:
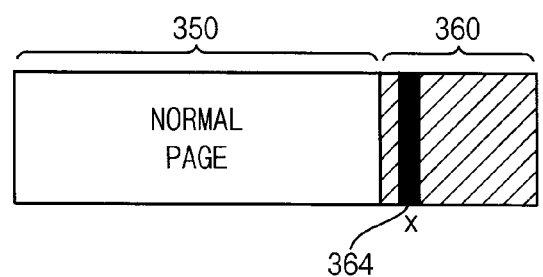

FIGS. 14 and 15 illustrate that errors occur in the second memory region of a semiconductor memory device according to example embodiments.

Referring to FIG. 14, when a failed page 362 is disposed in the second memory region 360, the failed page 362 may be replaced with a pass page 363 in the second memory region 360. In this case, the failed page 362 of the second memory region 360 may be replaced with the pass page 363 of the second memory region 360 in a reverse direction starting from a maximum page address of the second memory region 360.

Referring to FIG. 15, when a failed page 364 is disposed in the second memory region 360, an access to the failed page 364 may be blocked. In this case, the second memory region 360 includes a plurality of fuses, each of which is associated with each of second normal pages and the fuse associated with the failed page 364 may be cut to block an access to the failed page 364.

Figure 16:
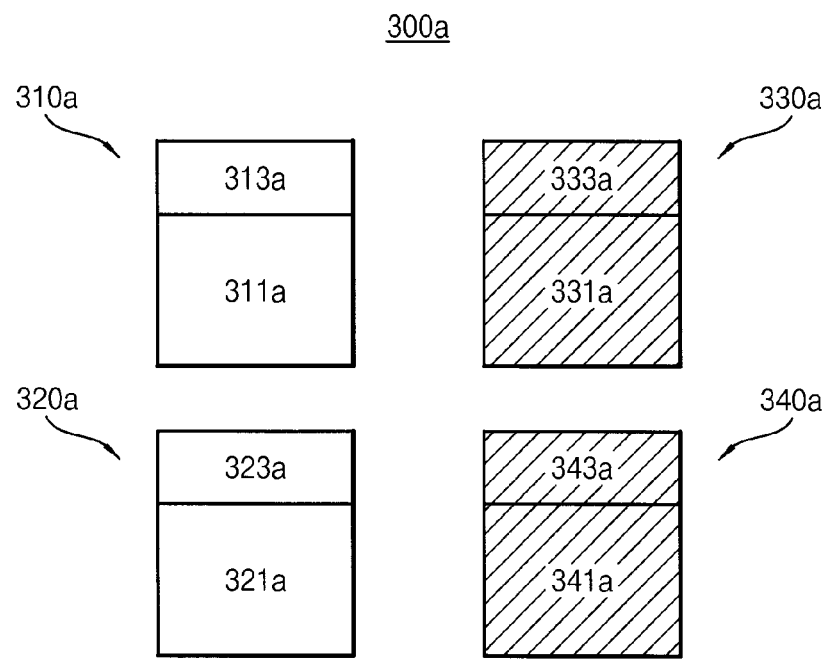
FIG. 16 is a block diagram illustrating the memory cell array in FIG. 3 according to example embodiments.

FIG. 16 is a block diagram illustrating the memory cell array in FIG. 3 according to example embodiments.

Referring to FIG. 16, a memory cell array 300a may include first through fourth bank arrays 310a~340a. The first bank array 310a may include a first portion 311a that stores first main data and a second portion 313a that stores first parity bits associated with the first main data. The second bank array 320a may include a first portion 321a that stores second main data and a second portion 323a that stores second parity bits associated with the second main data. The first and second bank arrays 310a and 320a may constitute the first memory region 350 in FIG. 5, which provides consecutive page addresses. The third bank array 330a may include a first portion 331a and a second portion 333a and the fourth bank array 340a may include a first portion 341a and a second portion 343a. The third and fourth banks arrays 330a and 340a may constitute the second memory region 360 in FIG. 5, which is reserved for bad page management for repairing failed cells or failed pages. Since the second portions 333a and 343a of the third and fourth bank arrays 330a and 340a do not include parity bits, the second portions 333a and 343a may be used for replacing failed pages disposed in the first portions 311a and 321a of the first and second banks arrays 310a and 320a or failed pages disposed in the first portions 331a and 341a of the third and fourth bank arrays 330a and 340a.

Figure 17:
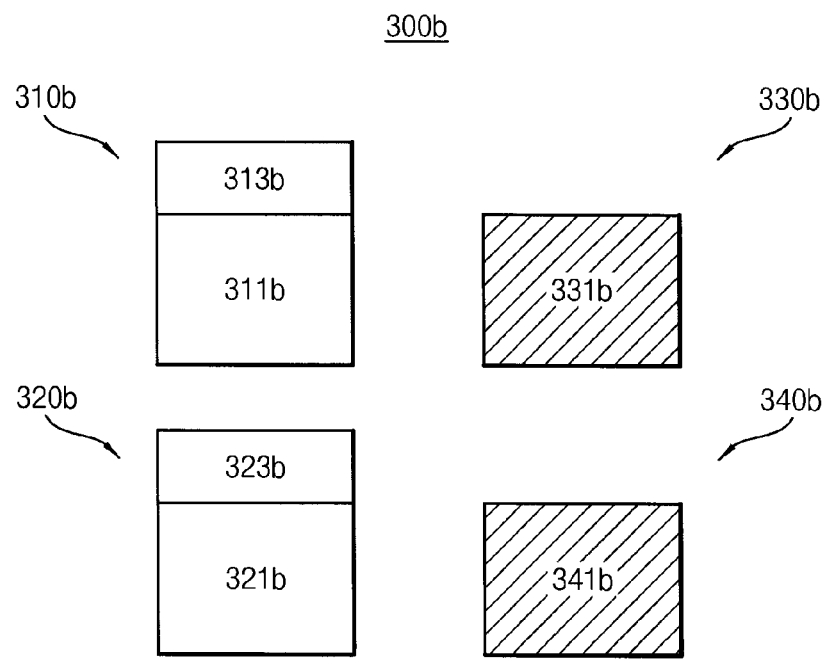
FIG. 17 is a block diagram illustrating the memory cell array in FIG. 3 according to other example embodiments.

FIG. 17 is a block diagram illustrating the memory cell array in FIG. 3 according to other example embodiments.

Referring to FIG. 17, a memory cell array 300b may include first through fourth bank arrays 310b~340b. The first bank array 310b may include a first portion 311b that stores first main data and a second portion 313b that stores first parity bits associated with the first main data. The second bank array 320b may include a first portion 321b that stores second main data and a second portion 323b that stores second parity bits associated with the second main data. The first and second bank arrays 310b and 320b may constitute the first memory region 350 in FIG. 5, which provides consecutive page addresses. The third bank array 330b may include a first portion 331b and the fourth bank array 340b may include a first portion 341b. The third and fourth banks arrays 330b and 340b may constitute the second memory region 360 in FIG. 5, which is reserved for bad page management for repairing failed cells or failed pages.

Figure 18:
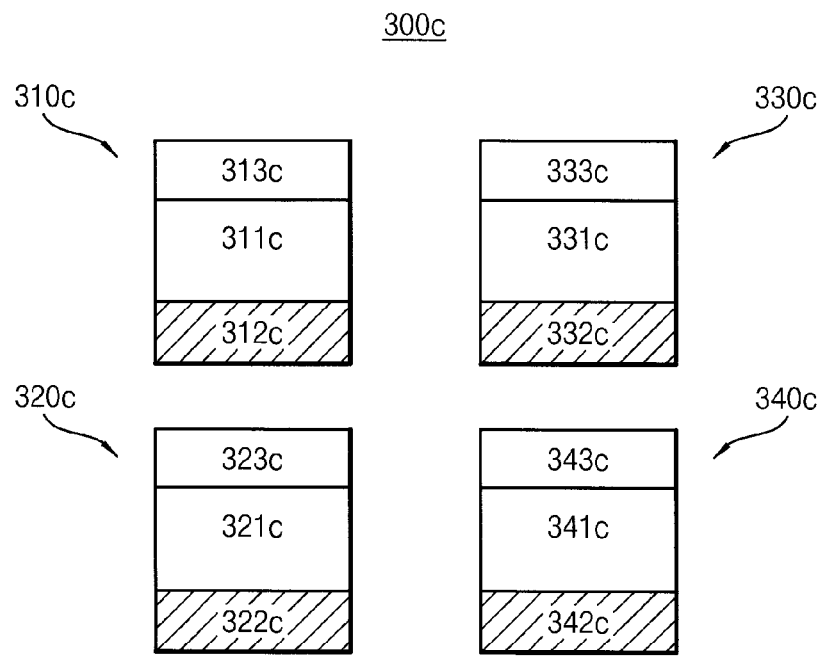
FIG. 18 is a block diagram illustrating the memory cell array in FIG. 3 according to still other example embodiments.

FIG. 18 is a block diagram illustrating the memory cell array in FIG. 3 according to still other example embodiments.

Referring to FIG. 18, a memory cell array 300c may include first through fourth bank arrays 310c~340c. The first bank array 310c may include a first portion 311c that stores first main data, a third portion 313c that stores first parity bits associated with the first main data and a second portion 312c that repairs failed pages. The second bank array 320c may include a first portion 321c that stores second main data, a third portion 323c that stores second parity bits associated with the second main data and a second portion 322c that repairs failed pages. The third bank array 330c may include a first portion 331c that stores third main data, a third portion 333c that stores third parity bits associated with the third main data and a second portion 332c that repairs failed pages. The fourth bank array 340c may include a first portion 341c that stores fourth main data, a third portion 343c that stores fourth parity bits associated with the fourth main data and a second portion 342c that repairs failed pages.

The first portions 311c, 321c, 331c and 341c may constitute the first memory region 350 in FIG. 5, which provides consecutive page addresses. The second portions 312c, 322c, 332c and 342c may constitute the second memory region 360 in FIG. 5, which is reserved for bad page management for repairing failed cells or failed pages.

Each of the first portions 311c, 321c, 331c and 341c and each of the second portions 312c, 322c, 332c and 342c may constitute a same mat. For example, each of the first portions 311c, 321c, 331c and 341c and each of the second portions 312c, 322c, 332c and 342c may constitute a merged bank.

Figure 19:
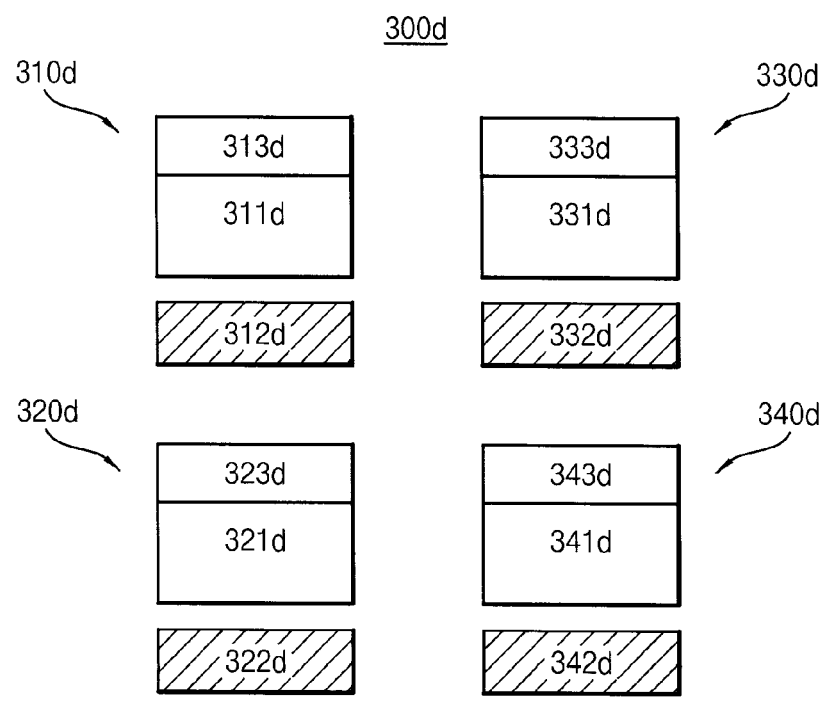
FIG. 19 is a block diagram illustrating the memory cell array in FIG. 3 according to still other example embodiments.

FIG. 19 is a block diagram illustrating the memory cell array in FIG. 3 according to still other example embodiments.

Referring to FIG. 19, a memory cell array 300d may include first through fourth bank arrays 310d~340d. The first bank array 310d may include a first portion 311d that stores first main data, a third portion 313d that stores first parity bits associated with the first main data and a second portion 312d that repairs failed pages. The second bank array 320d may include a first portion 321d that stores second main data, a third portion 323d that stores second parity bits associated with the second main data and a second portion 322d that repairs failed pages. The third bank array 330d may include a first portion 331d that stores third main data, a third portion 333d that stores third parity bits associated with the third main data and a second portion 332d that repairs failed pages. The fourth bank array 340d may include a first portion 341d that stores fourth main data, a third portion 343d that stores fourth parity bits associated with the fourth main data and a second portion 342d that repairs failed pages.

The first portions 311d, 321d, 331d and 341d may constitute the first memory region 350 in FIG. 5, which provides consecutive page addresses. The second portions 312d, 322d, 332d and 342d may constitute the second memory region 360 in FIG. 5, which is reserved for bad page management for repairing failed cells or failed pages.

Each of the first portions 311c, 321c, 331c and 341c and each of the second portions 312c, 322c, 332c and 342c may constitute different mats. For example, each of the first portions 311c, 321c, 331c and 341c and each of the second portions 312c, 322c, 332c and 342c may constitute a split bank.

Figure 20A:
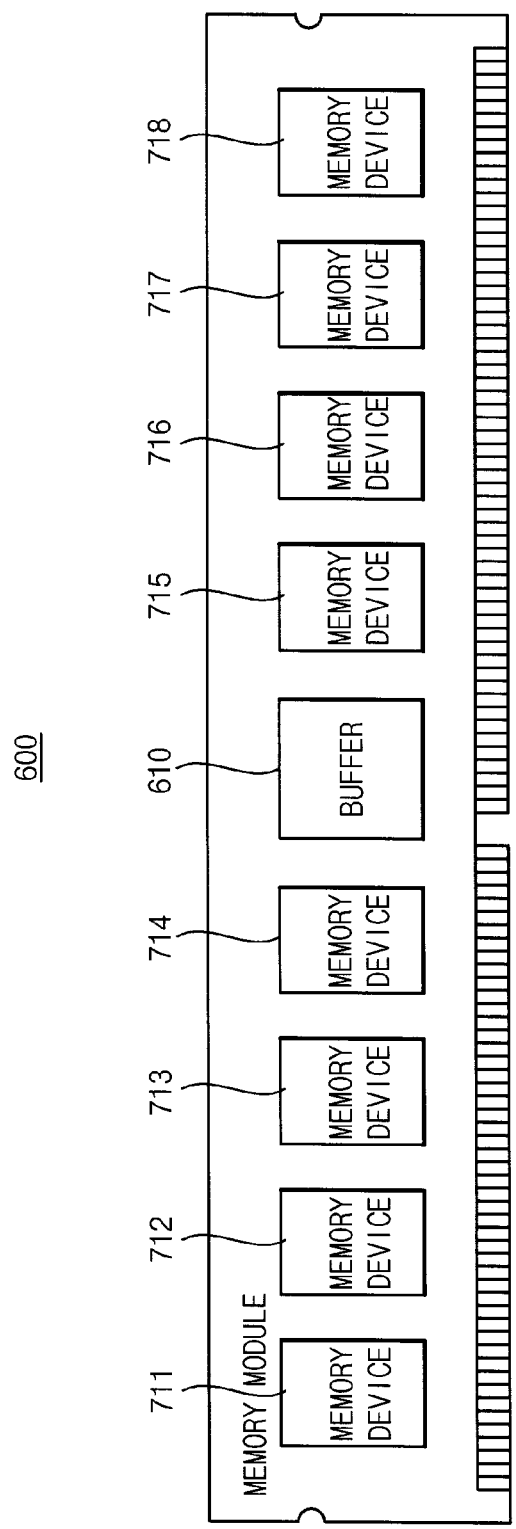
FIG. 20A is a block diagram illustrating a memory module including semiconductor memory devices according to example embodiments.

FIG. 20A is a block diagram illustrating a memory module including the semiconductor memory devices according to example embodiments.

Referring to FIG. 20A, a memory module 600 may include a plurality of semiconductor memory devices 711~718. In some embodiments, the memory module 600 may be, for example, an unbuffered dual in-line memory module (UDIMM), a registered dual in-line memory module (RDIMM), a fully buffered dual in-line memory module (FBDIMM) and a load reduced dual in-line memory module LRDIMM, etc.

The memory module 600 further includes a buffer 610 that provides a command/address signal and data by buffering the command/address signal and the data from a memory controller through a plurality of transmission lines. In some embodiments, data transmission lines between the buffer 610 and the semiconductor memory devices 711~718 may be coupled in a point-to-point topology, and command/address transmission lines between the buffer 610 and the semiconductor memory devices 711~718 may be coupled, for example, in a multi-drop topology, a daisy-chain topology, a fly-by daisy-chain topology, or the like. Since the buffer 610 buffers both the command/address signal and the data, the memory controller may interface with the memory module 600 by driving only a load of the buffer 610. Accordingly, the memory module 600 may include more semiconductor memory devices and/or more memory ranks, and a memory system may include more memory modules.

Each of the semiconductor memory devices 711~718 may employ the semiconductor memory device 200a of FIG. 3. Therefore, each of the semiconductor memory devices 711~718 includes first and second memory regions, where the first memory region provides consecutive address space to the memory controller by correcting single-bit errors using ECC circuit and the second memory region is reserved for bad page management for repairing failed cells or failed pages. Therefore, each of the semiconductor memory devices 711~718 is capable of consecutive address spacing and does not need to include redundant cells for repairing failed cells.

Figure 20B:
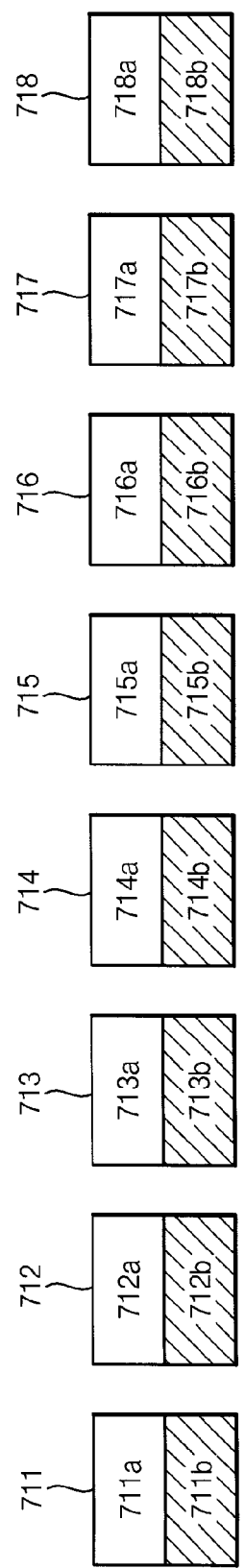
FIG. 20B illustrates configuration of the semiconductor memory devices in FIG. 20A.

FIG. 20B illustrates configuration of the semiconductor memory devices in FIG. 20A.

Referring to FIG. 20B, each of the semiconductor memory devices 711~718 includes each of first memory regions 711a~718a, each of which provides consecutive address space to the memory controller by correcting single-bit errors using ECC circuit and each of second memory regions 711b~718b, each of which is reserved for bad page management for repairing failed cells or failed pages.

Figure 20C:
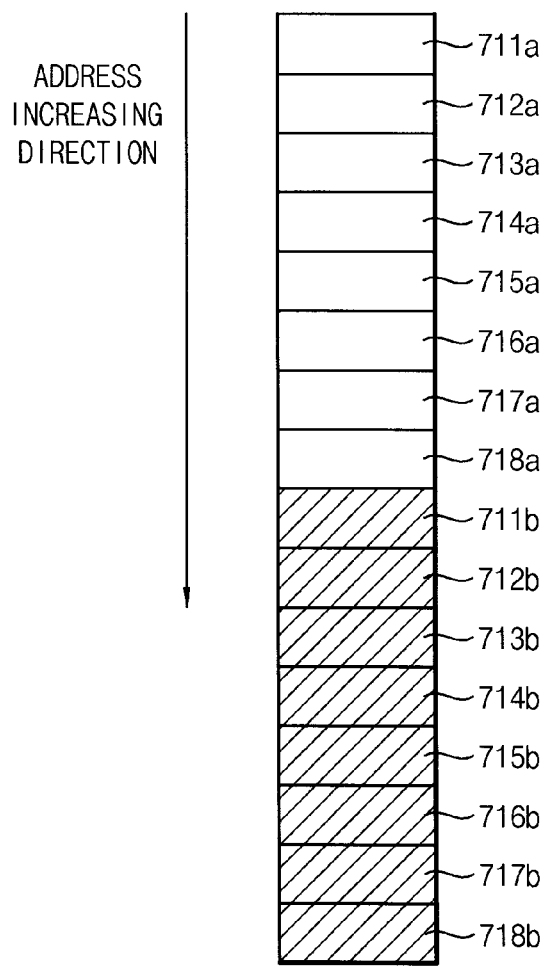
FIGS. 20C and 20D illustrate addressing schemes of the semiconductor memory devices in FIG. 20A.
Figure 20D:
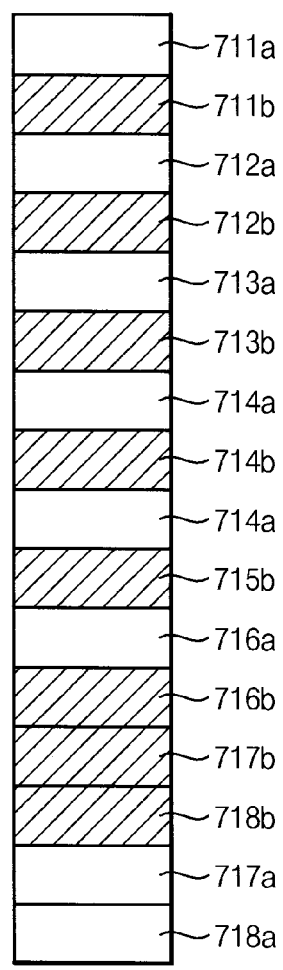

FIGS. 20C and 20D illustrate addressing schemes of the semiconductor memory devices in FIG. 20A.

Referring to FIG. 20C, the first memory regions 711a~718a and the second memory regions 711b~718b of the semiconductor memory devices 711~718 are remapped such that the entire first memory regions 711a~718a may provide consecutive address space to the memory controller. For example, single-bit errors disposed in each of the first memory regions 711a~718a may be corrected by corresponding ECC circuits, at least one failed page disposed in each of the first memory regions 711a~718a may be replaced with a pass page of each of the second memory regions 711b~718b in a reverse direction starting from a maximum page address of the second memory regions 711b~718b.

Referring to FIG. 20D, the first memory regions 711a~718a and the second memory regions 711b~718b of the semiconductor memory devices 711~718 are remapped such that at least some 717a and 718a of the first memory regions 711a~718a may provide a consecutive address space to the memory controller.

Figure 21:
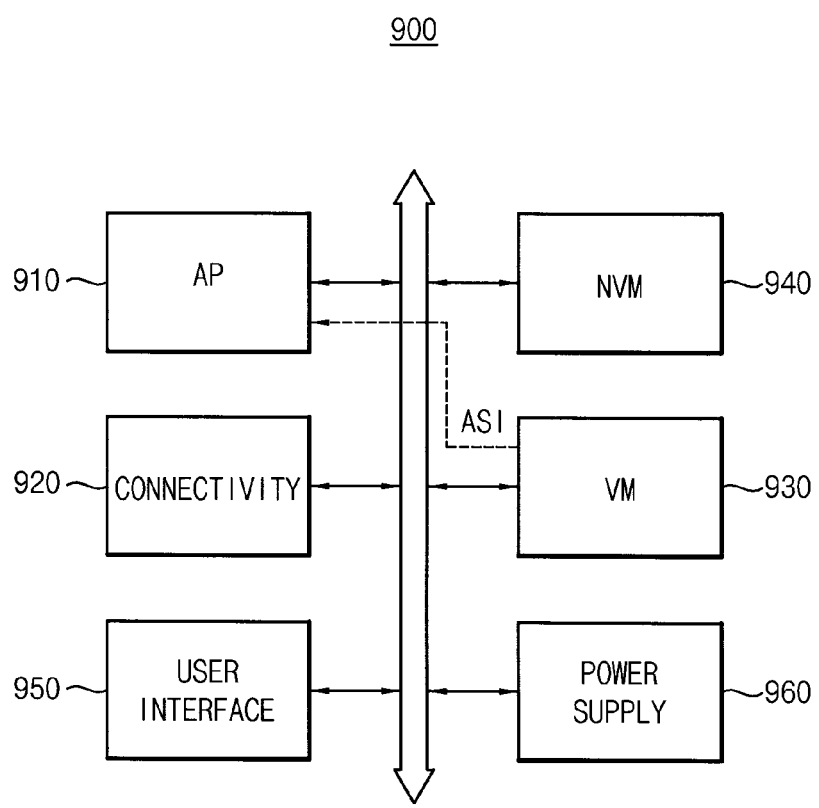
FIG. 21 is a block diagram illustrating a mobile system according to certain embodiments.

FIG. 21 is a block diagram illustrating a mobile system according to certain embodiments.

Referring to FIG. 21, a mobile system 900 includes an application processor 910, a connectivity unit 920, a semiconductor memory device 930, a nonvolatile memory device 940, a user interface 950 and a power supply 960. In some embodiments, the mobile system 900 may be, for example, a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In some embodiments, the application processor 910 may include a single core or multiple cores. For example, the application processor 910 may be a multi-core processor, such as a dual-core processor, a quad-core processor, a hexa-core processor, etc. The application processor 910 may include an internal or external cache memory. The application processor 910 may provide data mask signal DM to the semiconductor memory device 950.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The semiconductor memory device 930 may store data processed by the application processor 910 or operate as a working memory. The semiconductor memory device 930 may employ the semiconductor memory device 200a of FIG. 3. Therefore, the semiconductor memory device 930 includes first and second memory regions, where the first memory region provides consecutive address space to the application processor 910 by correcting single-bit errors by ECC circuit and the second memory region is reserved for bad page management for repairing failed cells or failed pages. Therefore, the semiconductor memory device 930 is capable of consecutive address spacing and does not need to include redundant cells for repairing failed cells. The semiconductor memory device 930 provides the application processor 910 with address information of the first and second memory regions as address space information ASI. The application processor 910 may access the semiconductor memory device 930 based on the address space information ASI.

The nonvolatile memory device 940 may store a boot image for booting the mobile system 900. For example, the nonvolatile memory device 940 may be, for example, an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 950 may include at least one input device, such as a keypad, a touch screen, etc., and at least one output device, such as a speaker, a display device, etc. The power supply 960 may supply a power supply voltage to the mobile system 900. In some embodiments, the mobile system 900 may further include a camera image processor (CIS), and/or a storage device, such as a memory card, a solid state drive (SSD), a hard disk drive (HDD), a CD-ROM, etc.

In some embodiments, the mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 22:
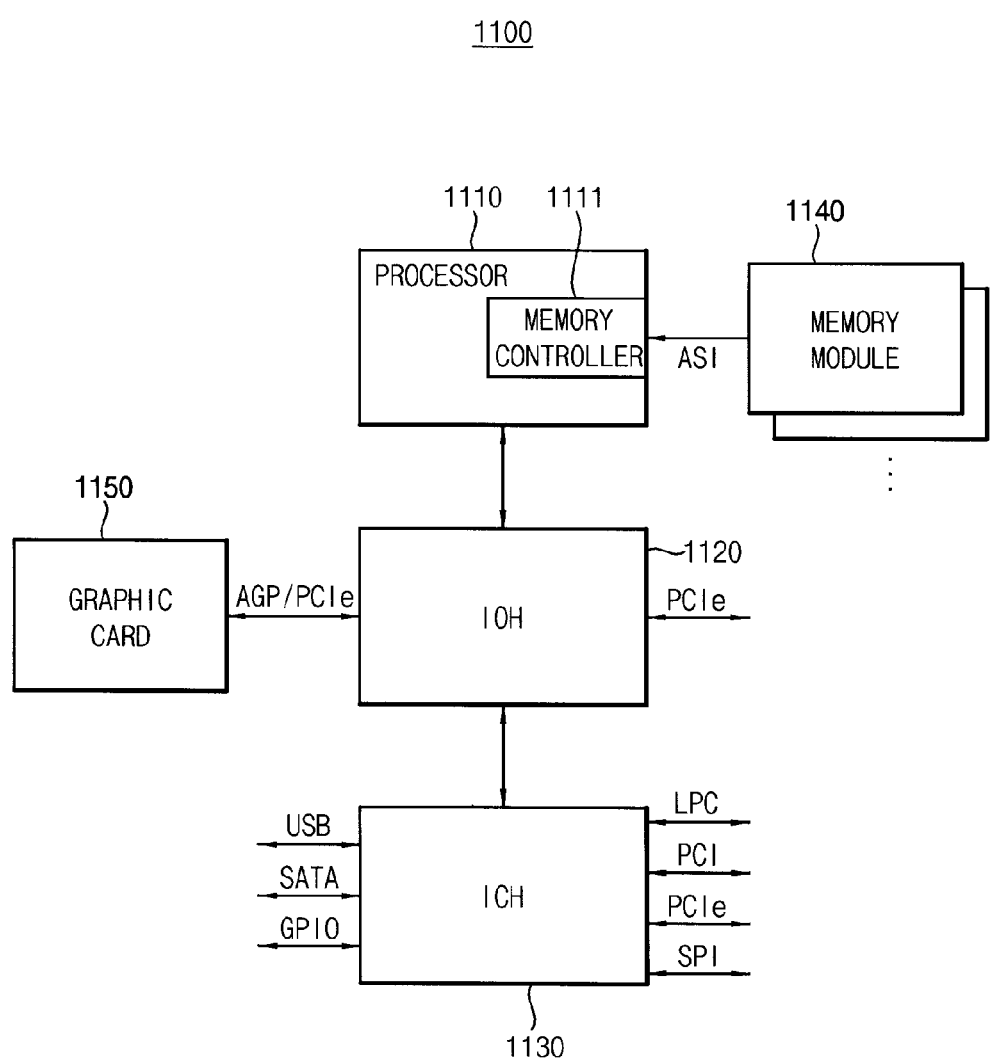
FIG. 22 is a block diagram illustrating a computing system according to certain embodiments.

FIG. 22 is a block diagram illustrating a computing system according to certain embodiments.

Referring to FIG. 22, a computing system 1100 includes a processor 1110, an input/output hub (IOH) 1120, an input/output controller hub (ICH) 1130, at least one memory module 1140 and a graphics card 1150. In some embodiments, the computing system 1100 may be, for example, a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 23 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may bay be implemented with multiple channels, to each of which at least one memory module 1140 may be coupled. In some embodiments, the memory controller 1111 may be located inside the input/output hub 1120, which may be referred to as memory controller hub (MCH).

The memory module 1140 may include a plurality of semiconductor memory devices that store data provided from the memory controller 1111. Each of the semiconductor memory devices may employ the semiconductor memory device 200a of FIG. 3. Therefore, each of the includes first and second memory regions, where the first memory region provides consecutive address space to the application processor 910 by correcting single-bit errors using ECC circuit and the second memory region is reserved for bad page management for repairing failed cells or failed pages. Therefore, each of the semiconductor memory devices is capable of consecutive address spacing and does not need to include redundant cells for repairing failed cells. Each of the semiconductor memory devices provides the memory controller 1111 with address information of the first and second memory regions as address space information ASI. The memory controller 1111 may access the semiconductor memory devices based on the address space information ASI.

The input/output hub 1120 may manage data transfer between processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 21 illustrates the computing system 1100 including one input/output hub 1120, in some embodiments, the computing system 1100 may include a plurality of input/output hubs. The input/output hub 1120 may provide various interfaces with the devices. For example, the input/ output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some embodiments, the input/output hub 1120 may include an internal graphics device along with or instead of the graphics card 1150 outside the graphics card 1150. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

As mentioned above, the semiconductor memory device includes first and second memory regions, where the first memory region provides consecutive address space to an external memory controller by correcting single-bit errors using ECC circuit and the second memory region is reserved for bad page management for repairing failed cells or failed pages. Therefore, the semiconductor memory device is capable of consecutive address spacing and does not need to include redundant cells for repairing failed cells.

The present disclosure may be applied to systems using memory controllers and semiconductor memory devices. The present disclosure may be applied to systems such as be a mobile phone, a smart phone, a personal digital assistant (PDA), a portable multimedia player (PMP), a digital camera, a music player, a portable game console, a navigation system, etc. The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A semiconductor memory device comprising:
    a memory cell array divided into a first memory region and a second memory region, each of the first and second memory regions including a plurality of pages each page including a plurality of memory cells connected to a word line; and
    an error correction code (ECC) circuit configured to correct single-bit errors of the first memory region using parity bits,
    wherein the first memory region provides a consecutive address space to an external device by correcting the single-bit errors using the ECC circuit and the second memory region is reserved for repairing at least one of a first failed page of the first memory region or a second failed page of the second memory region,
    wherein each of the first failed page of the first memory region and the second failed page of the second memory region is replaced by a corresponding pass page in the second memory region; and
    wherein each of the first and second memory regions includes the same number of pages.

2. The semiconductor memory device of claim 1, wherein the pass page is replaced in a reverse direction starting from a maximum page address of the second memory region.

3. The semiconductor memory device of claim 1, wherein an access to the first or the second failed page is blocked.

4. The semiconductor memory device of claim 1, wherein the first failed page has a multi-bit error.

5. The semiconductor memory device of claim 4, wherein the second failed page has at least one of a single-bit error and a multi-bit error.

6. The semiconductor memory device of claim 1, wherein the first memory region includes the parity bits and the second memory region includes none of the parity bits.

7. The semiconductor memory device of claim 1, wherein address space information of the first and second memory regions is provided to an external device through a separate pin of the semiconductor memory device.

8. The semiconductor memory device of claim 1, further comprising:
    a page control circuit configured to generate a first row address for accessing the first memory region and a second row address for accessing the second memory region based on a first memory access page address for accessing the memory cell array.

9. The semiconductor memory device of claim 8, wherein the page control circuit comprises:
    an address mapper configured to map the first memory access page address to a second memory access page address;
    a first normal page control circuit configured to generate the first row address in response to the second memory access page address; and
    a second normal page control circuit configured to generate the second row address in response to the second memory access page address.

10. The semiconductor memory device of claim 1, wherein the first memory region includes at least a first bank array including a first portion of memory cells that stores first main data, and a second portion of memory cells that stores first parity bits associated with the first main data, and
    wherein the second memory region includes at least a second bank array including first and second portions of memory cells that store second main data, and pages of the second portion of the second bank array are used for replacing failed pages of the first and second memory regions.

11. The semiconductor memory device of claim 1, wherein the first memory region includes at least a first bank array including a first portion of memory cells that stores first main data, and a second portion of memory cells that stores first parity bits associated with the first main data, and
wherein the second memory region includes at least a second bank array including a first portion of memory cells that stores second main data, and pages of the first portion of the second bank array are used for replacing failed pages of the first memory region.

12. The semiconductor memory device of claim 1, wherein the memory cell array includes at least a first bank array including a first portion of memory cells constituting the first memory region, a second portion of memory cells constituting the second memory region, and a third portion of memory cells that stores parity bits associated with main data stored in the first memory region, and
wherein a page of the second memory region is used for replacing a failed page of the first memory region.

13. A memory system, comprising:
a memory module including a plurality of semiconductor memory devices; and
a memory controller configured to control the semiconductor memory devices, wherein each of the semiconductor memory devices comprises:
a memory cell array comprising a plurality of memory cells arranged in rows and columns, wherein the memory cell array is divided into a first memory region and a second memory region; and
an error correction code (ECC) circuit configured to correct single-bit errors of the first memory region using parity bits,
wherein the first memory region provides a consecutive address space to the memory controller by correcting the single-bit errors by the ECC circuit and the second memory region is reserved for repairing at least one of a first failed page of the first memory region or a second failed page of the second memory region,
wherein each of the first failed page of the first memory region and the second failed page of the second memory region is replaced by a corresponding pass page in the second memory region; and
wherein each of the first and second memory regions includes the same number of pages.

14. The memory system of claim 13, wherein first memory regions of at least two of the semiconductor memory devices provide a consecutive address space to the memory controller by address mapping.

15. A semiconductor memory device comprising:
a first memory region including a first plurality of pages having a first range of page addresses, and connected to a plurality of memory cells;
a second memory region including a second plurality of pages having a second range of page addresses, and connected to a plurality of memory cells, wherein each page address of the first range is different from each page address of the second range;
a page control circuit configured to select any one of the first pages by a corresponding first page address and to select any one of second pages by a corresponding second page address, and configured to replace each of a first failed page in the first memory region and a second failed page in the second memory region with a corresponding page of the second memory region;
wherein each of the first and second memory regions includes the same number of pages.

16. The semiconductor memory device of claim 15, wherein the page control circuit includes an address mapper configured to provide a consecutive address space of the first memory region to an external device of the semiconductor memory device.

17. The semiconductor memory device of claim 16, further comprising:
a mode register configured to store information of the consecutive address space and provide the information of the consecutive address space to the external device,
wherein the external device accesses the semiconductor memory device based on the information of the consecutive address space.

18. The semiconductor memory device of claim 15, further comprising:
an error correction code (ECC) circuit configured to correct single-bit errors of the first memory region using parity bits,
wherein the parity bits are stored in the first memory region.

19. The semiconductor memory device of claim 15, wherein the first range of page addresses are consecutive addresses, and
wherein the second range of page addresses are consecutive addresses immediately following the first range.

* * * * *